United States Patent
Fowler et al.

(10) Patent No.: US 9,224,891 B2
(45) Date of Patent: Dec. 29, 2015

(54) PHOTODETECTION DEVICE

(71) Applicant: COMMISSARIAT A L'ENERGIE ATOMIQUE ET AUX ENERGIES ALTERNATIVES, Paris (FR)

(72) Inventors: Daivid Fowler, Saint Martin le Vinoux (FR); Roch Espiau de Lamaestre, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/370,592

(22) PCT Filed: Jan. 4, 2013

(86) PCT No.: PCT/IB2013/050081
§ 371 (c)(1),
(2) Date: Jul. 3, 2014

(87) PCT Pub. No.: WO2013/102876
PCT Pub. Date: Jul. 11, 2013

(65) Prior Publication Data
US 2014/0319465 A1    Oct. 30, 2014

(30) Foreign Application Priority Data
Jan. 6, 2012    (FR) ...................... 12 50169

(51) Int. Cl.
*H01L 31/0232*    (2014.01)
*H01L 29/06*    (2006.01)
(Continued)

(52) U.S. Cl.
CPC ........ *H01L 31/02327* (2013.01); *G02B 5/1861* (2013.01); *H01L 31/028* (2013.01);
(Continued)

(58) Field of Classification Search
CPC .............. H01L 31/0304; H01L 31/02327; H01L 31/028; H01L 31/0296; H01L 31/02966; H01L 31/03046; H01L 31/0312
USPC ............. 257/9, 15, 21, 88, 98, 103, 432, 436, 257/E31.097, E31.121, E33.06; 345/156, 345/175
See application file for complete search history.

(56) References Cited

U.S. PATENT DOCUMENTS

| 6,465,803 B1 * | 10/2002 | Bowers et al. .................. 257/21 |
| 8,618,622 B2 * | 12/2013 | Espiau De Lamaestre et al. ............................ 257/431 |

(Continued)

FOREIGN PATENT DOCUMENTS

| WO | 2005/081782 | 9/2005 |
| WO | 2007/054560 | 5/2007 |

OTHER PUBLICATIONS

Akio Mizutani et al., "Numerical Study . . . Kerr Medium", Optical Review, vol. 12, No. 4 (2005) 313-318.

(Continued)

*Primary Examiner* — Dao H Nguyen
(74) *Attorney, Agent, or Firm* — Clark & Body

(57) ABSTRACT

The invention relates to a photodetector for infrared light radiation having a given wavelength ($\lambda$), including a stack of layers consisting of: a continuous layer (11) of a partially absorbent semiconductor material, which constitutes the photodetection area; a spacer layer (12) of a material that is transparent to said wavelength and has an index ne; and a structured metal mirror (13), the distance (g) between the top of said mirror and the semiconductor layer being less than ($\lambda$)/ne and the mirror surface having a profile corresponding to the periodic repetition, according to period (P), of a basic pattern defined by the alternating series of raised surfaces (131, 132) and slots (133, 134) having the widths ($L_1, L_2$) and ($L_3, L_4$), respectively, the widths ($L_1$) to ($L_4$) being such that none are equal to zero, and that the sum thereof is equal to P and at least $L_1 \neq L_2$ or $L_3 \neq L_4$.

12 Claims, 6 Drawing Sheets

Figure 1:
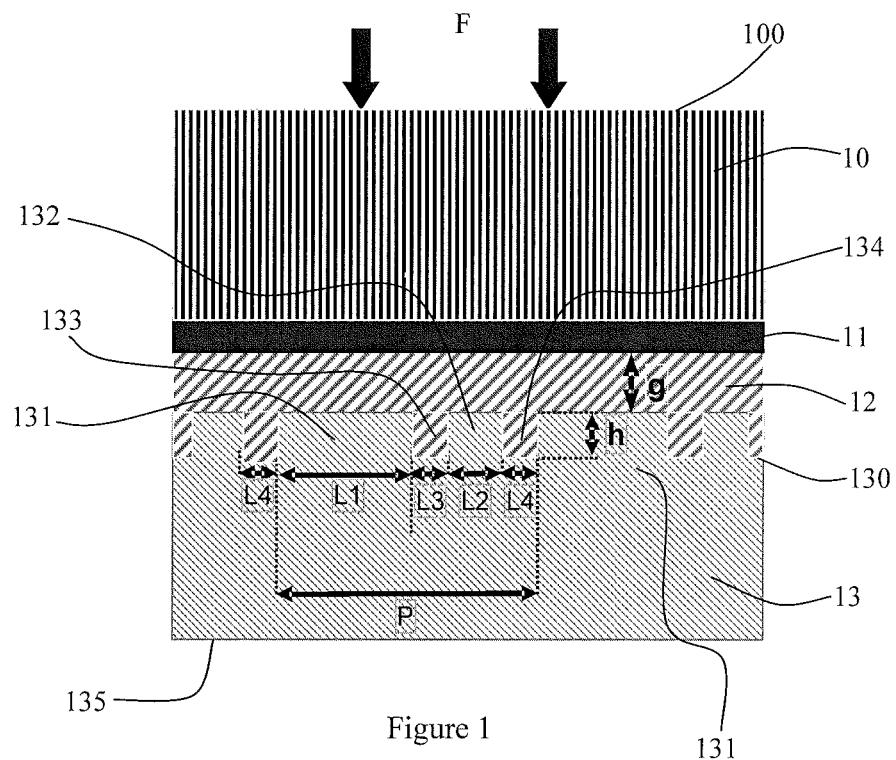

(51) Int. Cl.
*H01L 31/00* (2006.01)
*G02B 5/18* (2006.01)
*H01L 31/028* (2006.01)
*H01L 31/0296* (2006.01)
*H01L 31/0304* (2006.01)
*H01L 31/0312* (2006.01)

(52) U.S. Cl.
CPC ...... *H01L31/0296* (2013.01); *H01L 31/02966* (2013.01); *H01L 31/0304* (2013.01); *H01L 31/0312* (2013.01); *H01L 31/03046* (2013.01)

(56) References Cited

U.S. PATENT DOCUMENTS

| | | | |
|---|---|---|---|
| 8,884,271 B2 * | 11/2014 | Espiau De Lamaestre et al. | 257/21 |
| 2004/0123895 A1 | 7/2004 | Kardauskas et al. | |
| 2009/0020701 A1 | 1/2009 | Frey | |
| 2011/0019189 A1 | 1/2011 | Crouse et al. | |
| 2013/0032825 A1 * | 2/2013 | Wasserbauer | 257/88 |
| 2015/0041851 A1 * | 2/2015 | JangJian et al. | 257/187 |

OTHER PUBLICATIONS

K.W. Goossen et al., "Grating enhancement . . . detector response", Appl. Phys. Lett. 53 (12), Sep. 19, 1988, pp. 1027-1029.

J.Y. Andersson et al., "Near-unity quantum . . . grating coupler", Appl. Phys. Lett. 59 (7), Aug. 12, 1991, pp. 857-859.

Cui Dafu et al., "Quantum Well . . . Grating Enhancement", Infrared Phys. vol. 32, pp. 53-56, 1991.

J.Y. Andersson et al., "Grating-coupled quantum-well . . . and performance", J. Appl. Phys. 71 (7), Apr. 1, 1992, ppl. 3600-3610.

* cited by examiner

PHOTODETECTION DEVICE

The invention relates to a photodetector device, and in particular to an infrared photodetector.

Such a device has an absorbent semiconductor layer presenting determined thickness that is used for collecting photogenerated charges.

Infrared quantum photodetectors are already known. They need to be cooled well below ambient temperature, in order to minimize or even eliminate the so-called "dark current" process whereby carriers are generated, which process is in competition with photogeneration of free carriers, i.e. the useful signal.

Reducing the temperature of the detector is thus a conventional means in the prior art for maximizing the signal-to-noise ratio.

When the semiconductor used in the photodetector is mercury cadmium telluride (MCT), the thickness of the semiconductor layer is several micrometers, which maximizes absorption of infrared light.

A reduction in the volume of the semiconductor present in the photodetector also makes it possible to reduce the dark current. Reducing the thickness of the semiconductor layer has other advantages: reducing material cost and increasing detection speed.

Nevertheless, such a reduction in thickness of the semiconductor layer leads to a decrease in the quantum efficiency of the photodetector, which is not desirable, since any such reduction in efficiency leads to a decrease in the signal-to-noise ratio.

That is why it is conventional to associate a photodetector with a photon concentrator structure for the purpose of compensating for the loss of the quantum efficiency of the photodetector and thus making it possible to benefit from the reduction in dark current in order to obtain a good signal-to-noise ratio.

That structure may in particular be in the form of a structured metal mirror that is placed on the rear face of an absorbent semiconductor layer so as to reinforce absorption in said semiconductor layer.

Such a mirror may be used in particular in quantum well detectors, in the medium to far infrared spectrum range. Reference is made to the article by K. W. Goossen et al., Appl. Phys. Lett. 53, Sep. 19, 1998, p. 1027. That article describes a detector comprising a stack of layers forming quantum wells. At an angle of incidence normal to the detector, the detector is not absorbent. The mirror serves to reflect the incident wave at an angle so that it is absorbed by at least one quantum well. Such a mirror has also been proposed for improving the efficiency of solar cells made up of thin layers of amorphous Si, in the visible and in the near infrared.

In any event, a structured metal mirror makes it possible by diffraction to couple the incident radiation with the absorbent semiconductor layer.

Thus, the metal mirror may be structured in the form of a two-dimensional grating, in particular an array of studs in a variety of configurations, e.g. square studs in a square array or round studs in an array that is square or hexagonal.

The geometrical characteristics of such gratings can be optimized in terms of the efficiency with which they reinforce absorption.

Thus, certain references provide for the height of the studs or the depths of the holes in the mirror that is used to be of the order of one-fourth of the wavelength in use, in order to optimize the absorption of quantum wells. Mention may be made in particular of Document WO 2005/081782, or indeed the article by J. Y. Andersson et al., Appl. Phys. Lett. 59, Aug. 12, 1991, p. 857.

That leads to a mirror of considerable thickness, when the photodetector is used in the infrared.

Thus, with a material coating the structuring of the grating having a refractive index 2.5, the structuring presents a depth of about 400 nanometers (nm) for a wavelength of 4 micrometers (µm). This leads to mirrors having a thickness of about 500 nm, where thickness is measured between the bottom of the mirror and the top of the structuring.

That large thickness can give rise to various technological difficulties in fabrication.

For example, it is difficult to structure such thicknesses in a metal material, e.g. because of problems of depositing resin on flanks in so-called "lift-off" methods, of filling deep cavities, or of etching noble metals such as gold, making use of methods based on high temperature plasma, typically operating at temperatures higher than 200° C.

Certain references provide for using finer structuring, with holes having a depth of 200 nm for a wavelength of 10 µm, with such structuring enabling absorption to be reinforced in a quantum well detector. This is true of the above-mentioned article by K. W. Goossen and also of the article by Cui Dafu et al., Infrared Phys. 32 (1991), p. 53.

Nevertheless, the quantum efficiency of those photodetectors, like the quantum efficiency of the previously-mentioned photodetectors, depends very considerably on the angle of the incident light on the photodetector. Thus, the absorption spectrum of the semiconductor layer present in the photodetector has an absorption resonance peak that is a function of the angle of incidence of the incident light. It is found that with known mirrors, the position and the shape of the absorption peak vary considerably with the angle of incidence of the wave on the detector.

Thus, the above-mentioned article by Cui Dafu et al. shows very marked dependence on angle for quantum efficiency: this dependence is about 0.1° in the substrate and 0.3° in the incident medium (air). Elsewhere, the article by Andersson et al., J. Appl. Phys. 171 (1992), p. 3600 tends to show an angular response to that is very wide, being insensitive up to at least 15°. Nevertheless, the quantum efficiency under consideration is integrated over the spectrum range 8 µm to 12 µm, as opposed to quantum efficiency at a given wavelength as a function of angle of incidence. This is more difficult to obtain. It is advantageous since it makes it possible to envisage hyperspectral detection, i.e. detection at a plurality of wavelengths within a given detection range (e.g. four different "colors" in the same range 8 µm to 12 µm) without the colors becoming mixed when the radiation arrives at an angle of incidence.

Mention may also be made of Document WO 2007/054560, which describes an optical structure for localizing an electromagnetic field, used in a photodetector in order to obtain field concentration in an active detection zone. In particular, that photodetector can be used for detecting infrared radiation.

That structure includes a layer, e.g. a metal layer, having a surface that presents two symmetrical zones of portions in relief, separated by a third zone.

Each zone of portions in relief is obtained by repeating a unit pattern that is a series of two crenellations.

Thus, the third zone creates a defect in the periodicity of the optical structure.

The function of the optical structure is to couple the incident light to a mode that is guided along the metal layer and to localize the electric field under the metal layer, in this third zone. That is where the photodetector zone is also localized. In contrast, the peripheral zone surrounding the photodetection zone is not the seat of optical absorption.

The photodetection zone is not placed in the near field of the structured mirror since it is placed in the zone where there is a break in the periodicity of the structuring of the mirror. Furthermore, the peripheral zone is placed in the near field of the mirror but it does not participate in photodetection.

Finally, the photodetection zone is limited, since it corresponds to only a small portion of the localizing structure.

Limiting the detection zone involves technological constraints that make fabrication of the photodetector more complicated.

An object of the invention is to mitigate the drawbacks of prior art photodetectors by proposing a photodetector having a thin semiconductor layer and a structured metal mirror, and that increases the quantum efficiency of the absorption of said light radiation, e.g. measured as the ratio between the light power absorbed in the semiconductor to the incident light power.

The photodetector also presents considerable spectrum width.

Thus, the invention provides a photodetector for light radiation of given wavelength $\lambda$, the photodetector comprising a stack of layers with:

a continuous layer of a partially absorbent semiconductor material constituting the photodetection zone;

a spacer layer of material that is transparent at said wavelength and of refractive index ne; and a structured metal mirror, the distance g between the top of said mirror and the semiconductor layer being less than $\lambda$/ne and the surface of the mirror presenting a profile corresponding to periodically repeating a unit pattern at a period P, the pattern being defined by an alternating succession of portions in relief and of slots of respective widths $L_1$, $L_2$ and $L_3$, $L_4$, the widths $L_1$ to $L_4$ being such that none of them is zero, their sum is equal to P, and at least $L_1 \neq L_2$ or $L_3 \neq L_4$.

The photodetector also presents reduced sensitivity to the angle of incidence of the infrared light radiation used and an acceptance angle that is well defined.

Finally, there is no need for the semiconductor layer to be structured.

In preferred manner, the thickness e of the layer of semiconductor material satisfies the following relationship:

$$e \leq 0.7 \times \frac{\lambda}{4 \times \pi \times kSC}$$

where kSC is the imaginary part of the refractive index of said semiconductor material.

In preferred manner, the depth h of the slots lies in the range $\lambda$/12nc to $\lambda$/5nc, where nc is the real part of the index of the material present in the slots.

In a variant, the photodetector includes, on the layer of semiconductor material, a substrate that is transparent at said wavelength and that is of refractive index ns.

By way of example, the substrate may be the growth substrate for the absorbent semiconductor layer, e.g. a substrate of CdZnTe when it is desired to grow a layer of CdHgTe. The substrate may also contribute to the mechanical cohesion of the final photodetector.

In preferred manner, the period P is equal to $\lambda$/neff, where neff lies in the range min(ns, ne, nSC) and max(ns, ne, nSC), where nSC is the real part of the refractive index of said semiconductor material.

In a variant, the width $L_1$, $L_2$ of one of the portions in relief lies in the range (P/2)–$L_3$ and (2P/3)–$L_3$, and the width $L_3$, $L_4$ of the slots lies in the range $\lambda$/15ne to $\lambda$/5ne.

In preferred manner, g lies in the range $\lambda$/15ne to $\lambda$/3ne.

In another variant, the refractive index ne is greater than nSC/2.

In a first variant, the grating of said mirror presents a bundle of recessed lines.

In another variant, this grating presents two cross-bundles of parallel recessed lines. The lines may optionally also be parallel to the edges of the photodetector.

Selecting between a one-dimensional configuration and a two-dimensional configuration makes it possible to make the photodetector sensitive to or independent of the polarization of the incident light.

In preferred manner, the semiconductor material is selected from Si, Ge, SiGe, InAs, InSb, GaSb, PbS, PbSe, PbTe, and $Cd_xHg_{1-x}Te$ (with x<0.9), from ternary alloys such as InGaAsP, AlInAs, AlInSb, InAsSb, and InGaSb, from quaternary alloys such as InGaAsP and InGaAsSb, and from quinary alloys such as GaInAsSb or GaInAsSbP, and indeed a type II superlattice, e.g. InAs/InSb on GaSb.

Furthermore, the material of the spacer layer is selected from ZnS, CdTe, and III-V materials.

Figure 2:
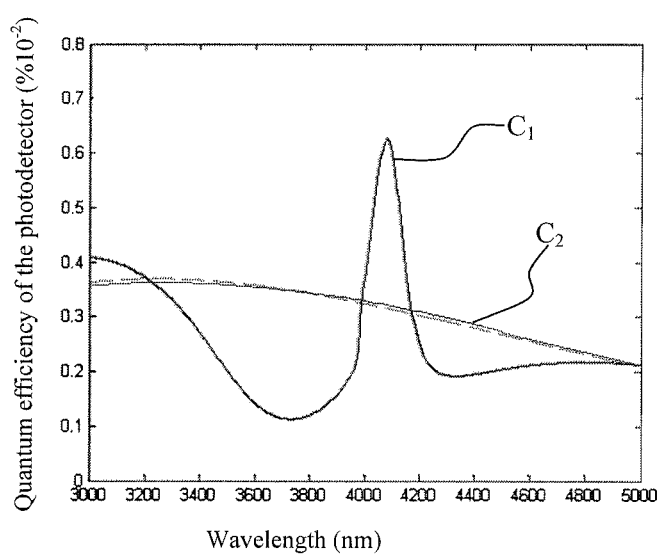
Figure 3:
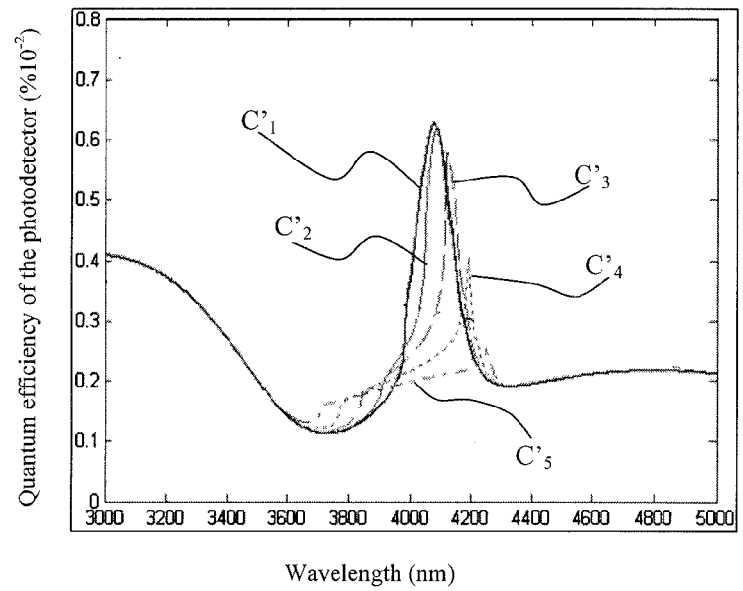
Figure 4:
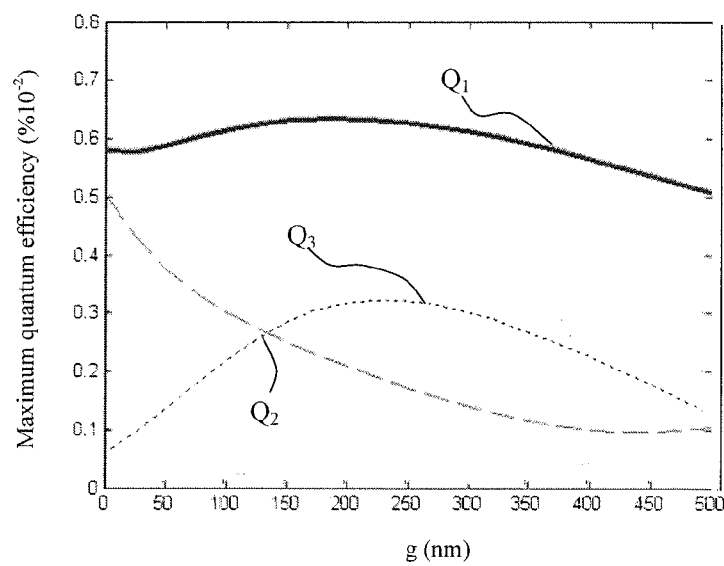
Figure 5:
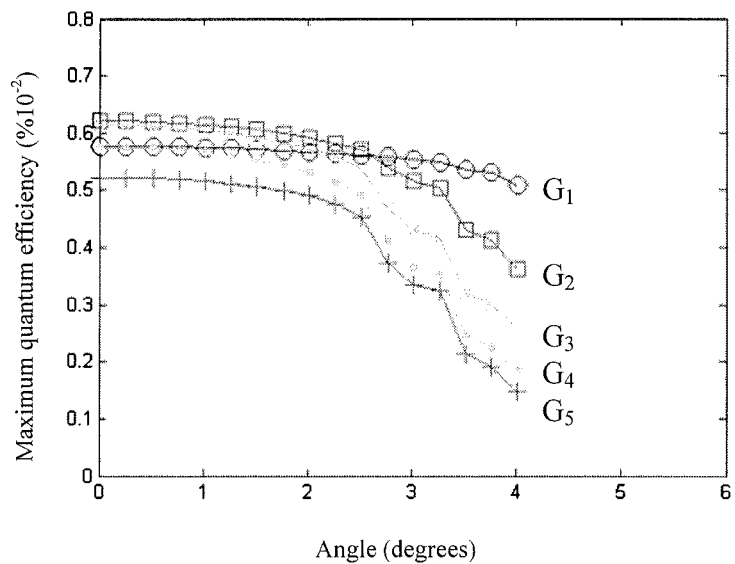
Figure 6:
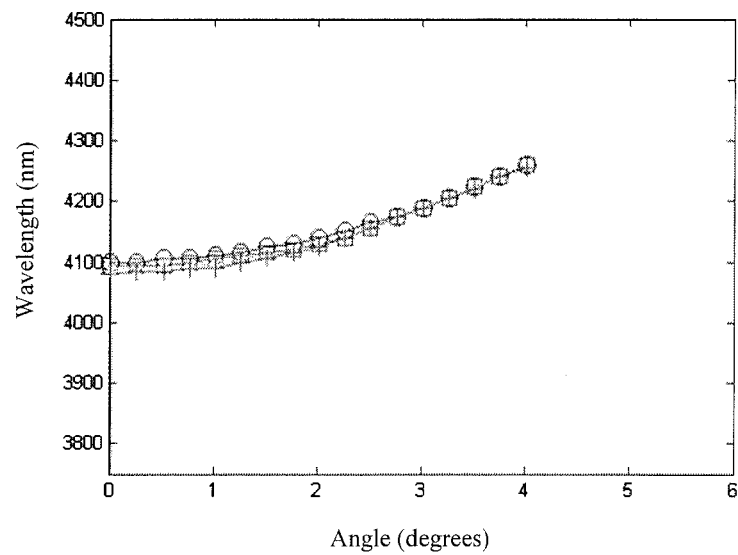
Figure 7:
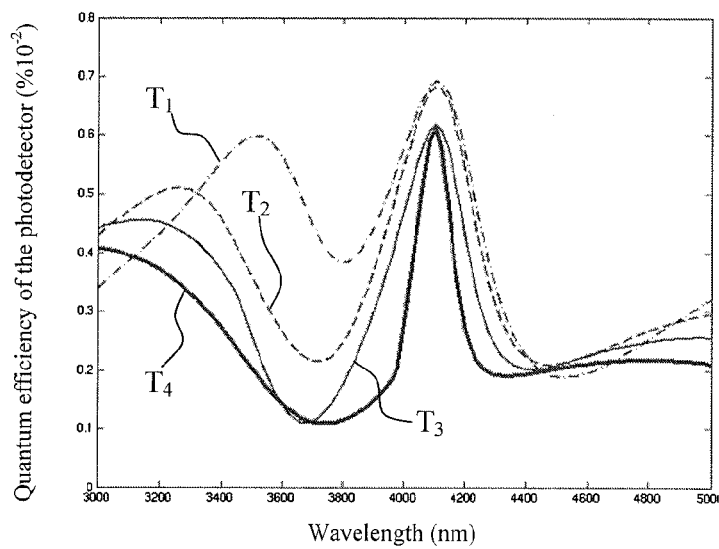
Figure 8:
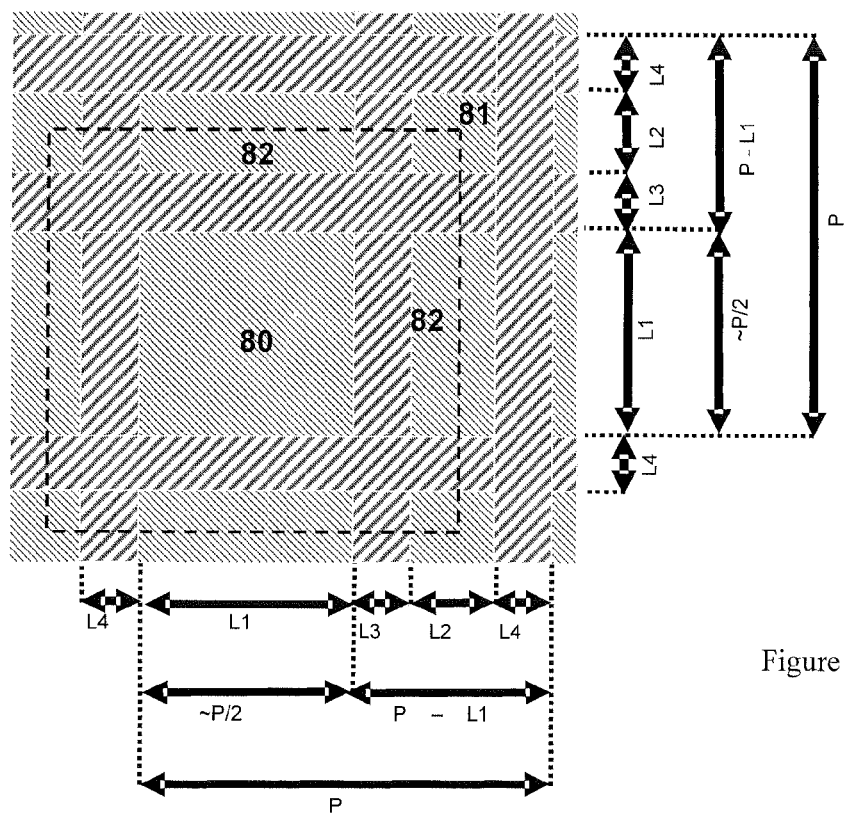
Figure 9:
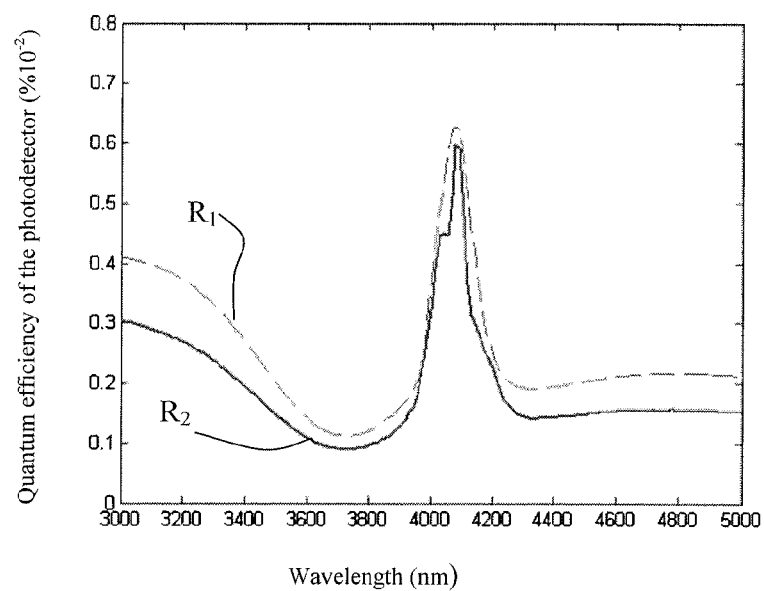
Figure 10:
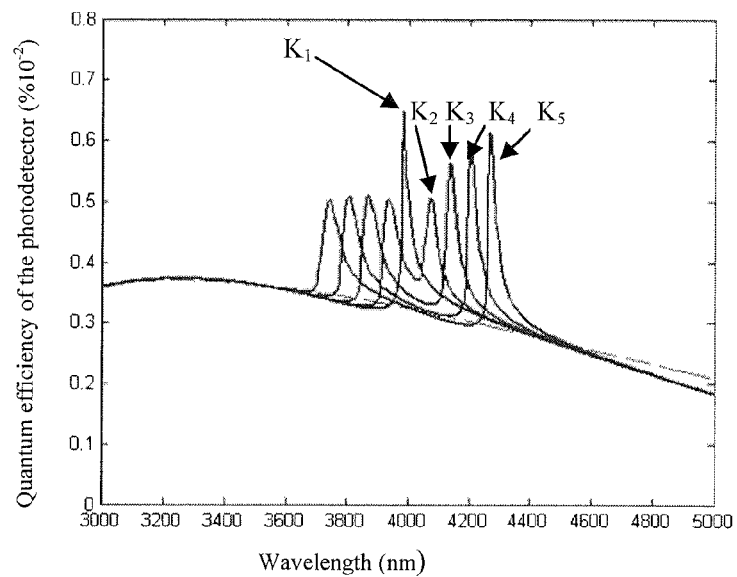
Figure 11:
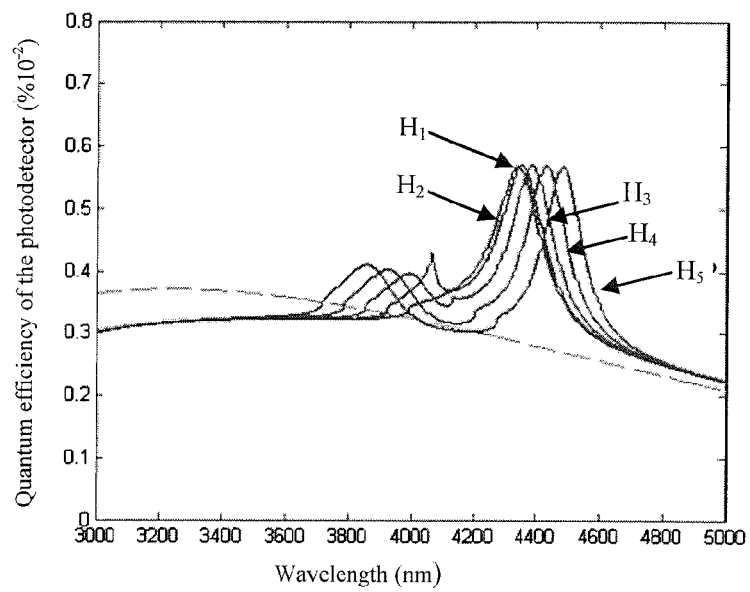

The invention can be better understood and other objects, advantages, and characteristics thereof appear more clearly on reading the following description, which is made with reference to the accompanying drawings, in which:

FIG. 1 is a section view of an example of a photodetector of the invention;

FIG. 2 plots two curves $C_1$ and $C_2$ relating to a photodetector of the invention (——) and to a photodetector including a non-structured mirror (— —) showing the quantum efficiency of the photodetector as a function of wavelength for incident light that is perpendicular to the photodetector;

FIG. 3 plots a set of five curves $C'_1$ to $C'_5$ showing the quantum efficiency of a photodetector of the invention as a function of wavelength for incident light perpendicular to the photodetector, and at different angles of incidence;

FIG. 4 plots three curves, a first curve $Q_1$ (——) representing the maximum quantum efficiency of a photodetector of the invention, a second curve $Q_2$ (— —) plotting the mean value of two values for the quantum efficiency of the same photodetector taken around the resonance peak, and a third curve $Q_3$ (• • • •) plotting the mean value of the quantum efficiency of a photodetector in which the mirror does not include structuring, these curves being a function of the parameter g and being given for incident light perpendicular to the photodetector;

FIG. 5 plots five curves $G_1$ to $G_5$ showing the maximum quantum efficiency of a photodetector of the invention as a function of angle of incidence, for five values of the parameter g;

FIG. 6 plots three curves $G'_1$, $G'_2$, and $G'_4$ showing the spectral position of the absorption maximum as a function of the angle of incidence for three values of the parameter g;

FIG. 7 plots a set of four curves $T_1$ to $T_4$ showing the quantum efficiency of a photodetector of the invention as a function of wavelength and for different refractive indices of the transparent substrate;

FIG. 8 is a fragmentary plan view of a mirror presenting two-dimensional structuring;

FIG. 9 plots two curves $R_1$ and $R_2$ showing the quantum efficiency of two photodetectors having the same dimensioning as a function of wavelength, one presenting a mirror having one-dimensional structuring and the other a mirror having two-dimensional structuring;

FIG. 10 plots a set of curves $K_1$ to $K_5$ similar to FIG. 3, for a photodetector of the prior art; and FIG. 11 plots a set of curves $H_1$ to $H_5$ similar to FIG. 3, for a photodetector in which the mirror has structuring with portions in relief and slots of the same length and particular characteristics.

FIG. 1 shows an example of a photodetector 1 of the invention.

The photodetector comprises a stack of layers, shown in section in FIG. 1, beginning with a substrate 10 that is transparent at the wavelength λ of the light radiation used.

The wavelength λ is longer than about 1 μm and may extend into the far infrared. It is typically about 30 μm.

Arrows F show the propagation of the incident light radiation at the front face 100 of the photodetector.

The light radiation propagates inside the substrate 10, being subjected to a refraction phenomenon on passing through the air-substrate interface, thereby modifying its angle of incidence in application of the Snell's law. Since the substrate has a refractive index greater than that of air, the angle of incidence in the substrate is smaller than the angle of incidence in air. The substrate acts as a semiconductor growth substrate, or as an element providing the mechanical cohesion of the photodetector.

The transparent substrate may be made of CdZnTe.

A layer of semiconductor material 11 is provided in contact with the transparent substrate 10. This layer 11 is continuous and constitutes the photodetection zone of the photodetector.

The refractive index of the semiconductor material comprises a real part nSC and an imaginary part kSC.

This transparent substrate may be omitted in other embodiments of the photodetector of the invention.

The semiconductor layer 11 is then in contact with air.

With reference to FIG. 7 it is shown that under such circumstances the maximum quantum efficiency of the photodetector of the invention is greater than with substrates presenting a higher index.

In practice, the material constituting the transparent substrate 10 thus presents a refractive index ns that lies in the range 1, the value of the index of air, and nSC, which is the real part of the refractive index of the material constituting the semiconductor layer.

Having the semiconductor layer bare diminishes the lifetime of the photodetector device, or indeed gives rise to a high level of recombination of the carriers photogenerated at the surface of said layer, thereby reducing the efficiency with which photogenerated charges are collected.

To mitigate this problem, an electrical passivation layer may be provided on the layer 11. This layer should be sufficiently fine to avoid influencing the optical characteristics of the device (typically it should be small compared with the wavelength). By way of example, it may be a layer of CdTe covered in a layer of ZnS, together presenting a thickness of about 100 nm.

The semiconductor material and its thickness are selected to ensure it is partially absorbent.

The thickness e of this layer of semiconductor material is selected so that the semiconductor layer 11 is not totally absorbent. It may advantageously satisfy the following relationship (1):

$$e \leq 0.7 \times \frac{\lambda}{4 \times \pi \times kSC} \quad (1)$$

where kSC is the imaginary part of the refractive index of the semiconductor material.

This material may be selected from the following materials: Si, Ge, SiGe, InAs, InSb, GaSb, PbS, PbSe, PbTe, or $Hg_xCd_{1-x}Te$ (with x<0.9), from ternary alloys such as InGaAs, AlInAs, AlInSb, InAsSb, or InGaSb, from quaternary alloys such as InGaAsP or InGaAsSb, and from quinary alloys such as GaInAsSb or GaInAsSbP, or indeed a type II superlattice, e.g. InAs/InSB on GaSb.

It should be observed that the type of doping and its concentration are irrelevant in the context of the invention. The photonic aspect of carrier generation is independent of how the carriers are collected. It is thus possible to use any conventional prior art collection system.

A pn junction may be made using two contact points in the semiconductor layer. An n-doped zone is made close to one contact and the carriers photogenerated in the p zone then diffuse towards the junction as formed in this way and they are collected.

The level of doping needed for forming this pn junction is quite low, typically of the order of $10^{17}$ atoms per cubic centimeter ($cm^3$) to $10^{19}/cm^3$. Consequently, it does not modify the optical absorption properties of the photodetector.

The stack also includes a metal mirror 13, and between the semiconductor layer 11 and the mirror 13, a spacer layer 12.

In the example shown in FIG. 1, on its surface 130 and in contact with the spacer layer 12, the mirror has a series of portions in relief that are described below.

This spacer layer 12 is made of a material that is transparent at the wavelength of the light radiation used, and that presents a refractive index ne.

This material may be ZnS, CdTe, or III-V materials, depending on the group to which the absorbent semiconductor belongs. It is also possible to envisage SiN, if the semiconductor material used is Ge or SiGe.

The refractive index ne of the material constituting this spacer layer is advantageously selected to be greater than nSC/2 so as to ensure proper operation of the photodetector.

This spacer layer 12 may perform the function of an electric passivation layer for the semiconductor layer 11 in which the charge carriers are photogenerated, in particular when the layer 11 is made of HgCdTe. This makes it possible to avoid any electrical contact with the mirror, so as to ensure that the photogenerated electrons are collected effectively.

The layer can also perform the diffusion barrier function, e.g. in order to prevent the metal constituting the mirror 13 from diffusing into the semiconductor layer 11.

Thus, the minimum thickness of the layer 12 should be about 50 nm.

It should be observed that the function of this spacer layer thus differs from that of the spacer layer described in the above-mentioned article by K. W. Goossen et al.

That layer is made of doped semiconductor material and it performs an electrical contact function.

There follows a description of the structuring of the surface 130 of the mirror 13.

The surface 130 presents a profile that corresponds to periodically repeating a unit pattern with a period P.

The unit pattern is of length equal to the period P.

It is defined by four parameters $L_1$ to $L_4$ along an axis of the surface 130, and by a parameter h along a perpendicular axis.

$L_1$ and $L_2$ correspond to the widths of the portions in relief 131 and 132 and $L_3$ and $L_4$ correspond to the widths of the portions of the surface 130 situated between the portions in relief. Thus, the portion 133 of width $L_3$ is situated between the portions in relief 131 and 132 of a given pattern, and the portion 134 of width $L_4$ is situated between the portion in relief 132 of one pattern and the portion in relief 131 of the adjacent pattern. The portions 133 and 134 are referred to as "slots".

In the example shown in FIG. 1, the portions in relief have substantially the same height h.

Each of the parameters $L_1$ to $L_4$ is non-zero and their sum is equal to P.

Finally, the parameters satisfy the condition whereby at least $L_1 \ne L_2$ or $L_3 \ne L_4$.

The mirror 13 needs to be placed in the near field of the thin semiconductor layer 11 in order to be able to reinforce the absorption of this layer 11.

For this purpose, the distance g between the top of the mirror 13 and the semiconductor layer 11 must be less than $\lambda/\text{ne}$, where ne is the refractive index of the spacer layer 12. The top of the mirror is defined by the top face of the portions in relief 131 and 132.

This distance typically lies in the range $\lambda/15\text{ne}$ to $\lambda/3\text{ne}$. In this range of values, it is possible to improve rejection while conserving large amounts of insensitivity to angle and spectrum width.

This is described in detail below.

The structuring of the mirror 13 makes it possible to couple the incident light with a guided mode parallel to the semiconductor layer 11 with an evanescent electric field that is at a maximum at the top of the mirror and that decreases going towards the substrate 10. In a so-called "near-field" configuration, the absorbent layer 11 is placed sufficiently close to the mirror to be in this region for reinforcing the electromagnetic field. This corresponds to a distance g less than $\lambda/\text{ne}$ from the surface of the mirror.

The positioning of the absorbent layer in the near field with the structured mirror serves to enlarge the spectrum response and to improve the insensitivity to angle of the photodetector as a function of the angle of the incident light.

The mirror may be structured in one or two dimensions.

With one-dimensional structuring, the portions in relief 131 and 132 extend over the surface 130 along lines that are substantially parallel. In other words, the grating of the mirror is defined by a bundle of indented or projecting lines.

For a mirror of this type, absorption resonance is thus generated solely in TM polarization, i.e. for the incident light radiation having a magnetic field parallel to the lines of the grating.

Structuring may also be provided in two dimensions, as described below with reference to FIG. 8.

The materials that can be used for making the mirror 13 are noble metals such as gold, aluminum, and copper, or indeed any other metal, providing its conductivity is not less than one-twentieth the conductivity of gold.

The structuring may include a thin layer of metal serving to stick the preceding metal on the spacer layer 12, e.g. titanium Ti.

The period P of the structuring serves to adjust the resonant wavelength $\lambda_{rs}$ in application of equation (2):

$$\lambda_{rs} = n\text{eff} \cdot P \quad (2)$$

where neff is an effective refractive index lying in the range min(ns, ne, nSC) to max(ns, ne, nSC).

The widths $L_3$ and $L_4$ of the slots 133 and 134 of the profile of the surface 130 are selected to lie in the range $\lambda/15\text{ne}$ and $\lambda/5\text{ne}$.

The value of $L_3$ or $L_4$ in this range depends to a small extent on the height h of the portions in relief and it can be optimized.

The width $L_1$ of one of the portions in relief of the pattern should lie in the range $(P/2)-L_3$ and $(2P/3)-L_3$.

The width $L_2$ of the other portion in relief of the pattern is then given by the relationship:

$$L_2 = P - (L_1 + L_3 + L_4)$$

FIG. 1 shows a width $L_1$ greater than $L_2$. Nevertheless, this characteristic is not limiting in any way. The widths $L_1$ and $L_2$ are interchangeable given that the same pattern is repeated over the surface 130 of the mirror.

Finally, the depth of the structuring of the mirror, i.e. the height h of the portions in relief 131 or 132, or indeed the depth of the slots 133 or 134, should lie in the range $\lambda/12\text{ne}$ to $\lambda/5\text{ne}$ and it is typically selected to be substantially equal to $\lambda/7\text{ne}$.

If the material filling the slots 133 and 134 is different from the material present between the top of the mirror 13 and the semiconductor layer 11, then h should lie in the range $\lambda/5 \cdot \text{nc}$ to $\lambda/12 \cdot \text{nc}$, where nc is the real part of the refractive index of the material.

In practice, the procedure for determining the parameters of the grating from a given vertical stack in which the constituent materials, the thickness of the semiconductor layer, and the parameter g are all given, is as follows (with $L_3$ being equal to $L_4$ in this example):

Firstly, a simulation method is used (e.g. of the (FDTD) or finite element method (FEW) type) for simulating the response of a single slot photodetector to TM polarized incident light.

The electric field should be calculated as a function of the wavelength of the incident light at a point close to the opening of the slot.

For the slot having a width $L_3$ in the above-defined range, it is appropriate to find the value h that corresponds to an intensity peak in the electric field at the desired wavelength.

Thereafter, by setting $P = \lambda/\text{ns}$, it is possible to construct a grating. The simulation is then performed on the basis of a repeated pattern.

The specific values for $L_1$, $L_2$, and $L_3$ are selected from the above-defined ranges, using optimization to maximize maximum absorption and/or angular stability. This step is performed using a simulation method with periodic boundary conditions.

Once the parameters $L_1$ and $L_2$ have been optimized, the absorption peak is generally redshifted a little, relative to $\lambda = \text{ne} \cdot P$. In order to obtain a peak at the desired wavelength, $P_1$ and $L_1$ may be reduced in proportion, so as to obtain the desired correction.

It should be observed that the height h is relatively small compared with the incident wavelength in the spacer layer 12. This makes it technologically easier to make the mirror 13.

Thus, by way of comparison, the mirrors described in the above-mentioned article by J. Y. Andersson et al. present a structuring height h of about $\lambda/4\text{nc}$, where nc is generally equal to ne.

Furthermore, in the above-mentioned range of heights h, which is relatively narrow, the photodetector presents little sensitivity to angle, as shown with reference to FIG. 3.

A particular embodiment of a photodetector as shown in FIG. 1 is described below.

The influences of the various above-mentioned parameters are revealed in this particular example, comprising a mirror that is structured one-dimensionally.

Thus, the photodetector in question comprises a transparent substrate layer and a spacer layer made of CdTe having a refractive index of 2.68, and a mercury cadmium telluride (MCT) type semiconductor layer having the general formula $Hg_xCd_{1-x}Te$, with x=0.3 at a temperature of 77 K.

The wavelength λ of the incident light radiation lies in the range 3 μm to 5 μm.

Furthermore, the imaginary part kSC of the refractive index of the semiconductor material is about 0.26 for a wavelength of 4 μm. Thus, equation (1) leads to the semiconductor layer having a thickness of less than about 850 nm, for this wavelength.

In this particular example, the thickness of the semiconductor layer is selected to be equal to 100 nm.

The metal mirror is made of gold and the distance g between the top of the metal mirror and the semiconductor layer 11 is equal to 250 nm. It is thus less than λ/ne for the range of wavelengths in use. It also lies in the preferred range of λ/15ne to λ/3ne.

Furthermore, the thickness between the surface 130 corresponding to the bottoms of the slots, and the bottom of the mirror, corresponding to the surface 135 remote from the surface 130, is not less than the skin thickness at the wavelength under consideration. This thickness is about 25 nm for a mirror made of gold and using a wavelength of 4 μm.

The period P of the grating is selected to be equal to 1490 nm, which corresponds to about λ/ne, with ne indeed lying in the range min(ne, ns, nSC) to max(ne, ns, nSC).

The widths $L_3$ and $L_4$ of the slots 133 and 134 are equal in this example. They are selected to be equal to 125 nm. This value does indeed lie in the range in use of λ/15ne to λ/5ne (100 nm to 300 nm for λ=4 μm).

The width $L_1$ of one of the portions in relief of the pattern is selected to be equal to 740 nm. This value corresponds to substantially to P/2 and it does indeed lie in the above-mentioned range.

The width $L_2$ of the other portion in relief of the pattern is thus equal to 500 nm, given the values selected for P, $L_1$, $L_3$, and $L_4$.

Finally, the depth of the structuring of the mirror, i.e. the height h, is 220 nm, which corresponds to about λ/7ns. This value for h is mentioned above, it being understood that in this example the values of the refractive indices ns and ne are equal.

In FIG. 2, a curve $C_1$ drawn in continuous lines plots the quantum efficiency of this example photodetector (i.e. the ratio of the absorbed power to the incident power, or indeed the ratio of the number of electron-hole pairs actually generated by absorption in the semiconductor layer to the number of incident photons) as a function of wavelength (expressed in nm) for incident light that is perpendicular to the photodetector, having TM polarization and at an operating temperature of 77 K.

This absorption layer reveals a resonance peak that is a function of the angle of incidence and of the resonant wavelength, which in this example is about 4080 nm.

This curve shows that light absorption in the semiconductor layer is at about 63% of the incident power at the resonant wavelength.

In the absence of structuring of the mirror, this absorption would lie in the range only 20% to 40% of the incident power.

This is shown by curve $C_2$ which gives the quantum efficiency of a photodetector having a mirror without structuring, the photodetector otherwise having the same structure as the photodetector of the invention and having the same constitute materials.

It should also be observed that the curve $C_2$ corresponds substantially to the quantum efficiency curve of the above-described example photodetector of the invention when used with TE polarization.

The similarity between these two curves shows that TE polarized light does not see the structuring of the mirror, so the response of the photodetector of the invention is identical to the TM response of a photodetector having a mirror without structuring. This shows the sensitivity of the response of the photodetector of the invention to the polarization of the incident light.

Finally, curve $C_1$ shows that the photodetector of the invention makes it possible to reduce the background absorption for wavelengths situated around the resonant wavelength.

This notion of background absorption refers to the response of the photodetector throughout the spectrum range away from the resonance peak(s), i.e. the peaks that are due to the structuring of the mirror.

Thus, for curve $C_1$, the background absorption is the absorption for wavelengths shorter than 4 μm or longer than 4.2 μm, insofar as resonance is at about 4.1 μm, and insofar as this curve presents only one resonance peak.

FIG. 2 shows that for the curve $C_1$ this background absorption is low. Consequently, spectral rejection is considerable, where rejection is defined as the ratio between the maximum quantum efficiency and the background absorption. This can be seen more clearly in FIGS. 10 and 11 which plot absorption curves for photodetectors in which the mirror has structuring respectively with portions in relief and with slots of the same width.

It should be observed that the value of the period P and the value of the width $L_1$ of one of the portions in relief can be used to adjust the value of the resonant wavelength, while otherwise having unchanging values for h, g, $L_3$, and $L_4$. Thus, with the above-described photodetector, varying P over the range 1190 nm to 1790 nm and varying $L_1$ over the range 595 nm to 895 nm enables the resonant wavelength to be varied over the range 3.24 μm to 4.86 μm.

Detailed results are summarized in the table below.

| P | L1 | L2 | $\lambda_{max}$ | $QE_{max}$ |
|---|---|---|---|---|
| 1190 | 595 | 345 | 3240 | 0.64 |
| 1290 | 645 | 395 | 3540 | 0.62 |
| 1390 | 695 | 445 | 3820 | 0.62 |
| 1490 | 745 | 495 | 4080 | 0.63 |
| 1590 | 795 | 545 | 4340 | 0.61 |
| 1690 | 845 | 595 | 4600 | 0.55 |
| 1790 | 895 | 645 | 4860 | 0.40 |

In practice, the resonant wavelength is adjusted by the geometrical parameters of the structure, such as the natures and the thicknesses of the materials in contact with the semiconductor layer, the metal constituting the structured mirror, the thickness of the semiconductor layer, or the value of g. Nevertheless, compared with selecting P and $L_1$, variations in these parameters are of second order in terms of adjusting the resonant wavelength.

Reference is now made to FIG. 3 which plots a set of curves similar to that of FIG. 2 corresponding to angles of incidence varying over the range 0° to 4°. These curves are obtained with a photodetector of the invention, identical to that of the above-described example.

Thus, continuous line curve $C'_1$ corresponds to the curve $C_1$ shown in FIG. 2. The light radiation is thus perpendicular to the surface of the photodetector.

Curve $C'_2$ also corresponds to a curve showing the quantum efficiency of the photodetector as a function of wavelength, but for incident light on the layer 11 at an angle of 1° relative to the normal.

Likewise, curve $C'_3$ corresponds to a variation of the angle of incidence of 2°, curve $C'_4$ to a variation of 3°, and curve $C'_5$ to a variation of 4°.

This set of curves shows that the quantum efficiency of the photodetector does not vary as a function of the angle of incidence providing the variation lies within the range ±2° in the transparent substrate 10, which corresponds to variation of ±5.4° in air.

For an angle of incidence of 2° (curve $C'_3$), the value of the quantum efficiency at the resonance peak is about 95% of the corresponding value for a zero angle of incidence (curve $C'_1$). Furthermore, with this curve $C'_3$, the resonant wavelength is offset only a little from the resonant wavelength corresponding to curve $C'_1$. This offset is about 1%.

In contrast, once the angle of incidence becomes greater than 2°, the value of the quantum efficiency at the resonance peak decreases rapidly.

This shows both that the photodetector of the invention is practically insensitive to angle over an angle range of about ±2°, and that this photodetector presents a well-defined acceptance angle corresponding to this range. In other words, the photodetector does indeed see the same color in this range.

Tests have been performed to study the influence of the parameter h. While keeping all of the other parameters equal, the value of h was modified and curves similar to those of FIG. 3 were obtained.

Those tests show that when the height h of the portions in relief is less than the above-defined range (e.g. equal to 120 nm or 170 nm), quantum efficiency is low even for light perpendicular to the photodetector. Furthermore, when the height h is greater than this range (e.g. equal to 320 nm), sensitivity to angle increases and the acceptance angle property is lost. Furthermore, for even greater values of h (e.g. h equal to 420 nm), quantum efficiency becomes low again.

Finally, FIG. 3 also shows that for angles of incidence greater than 2°, the photodetector of the invention makes it possible practically to eliminate the interfering peaks that are offset in wavelength away from the resonant wavelength. When the curve giving quantum efficiency of the photodetector as a function of wavelength includes interfering peaks, the photodetector gives a response for wavelengths that differ depending on angle of incidence. It is thus advantageous to eliminate such peaks when it is desired to make an image at a given wavelength regardless of the viewing angle. This applies in particular for spectral or hyperspectral imaging applications.

The elimination of interfering peaks for a photodetector of the invention can be seen clearly by comparing FIGS. 10 and 11.

Thus, FIG. 10 shows a set of curves similar to that of FIG. 3, for a photodetector of the type described in the above-mentioned articles by K. W. Goossen et al. and by Cui Dafu et al. That photodetector thus has a mirror structured with a periodic pattern, the pattern having a single slot and thus a single portion in relief.

With the exception of the mirror, that photodetector is constituted by the same stack as the above-described example photodetector, the stack being made of the same materials. Thus, it comprises a semiconductor layer of $Hg_xCd_{1-x}Te$ type with thickness of 100 nm.

The structuring period of the mirror was selected to be equal to 1490 nm, the width of the portion in relief was 1190 nm, and the width of the slot was 300 nm.

Finally, the height h of the structuring of the mirror was selected to be equal to 525 nm.

Each of the curves $K_1$ to $K_5$ gives the quantum efficiency of the photodetector as a function of wavelength and for angles of incidence going from 0° (curve $K_1$) to 4° (curve $K_5$).

FIG. 10 shows that for incident light perpendicular to the photodetector (curve $K_1$), the resonance peak corresponds to quantum efficiency of about 65%. Nevertheless, as soon as the angle of incidence increases, the curve has two peaks instead of only one, with these two peaks shifting quickly and symmetrically as a function of angle of incidence.

It can be seen that the response of that photodetector varies considerably as soon as the incident light is no longer perpendicular to the photodetector. It is therefore highly sensitive to angle.

Furthermore, the intensity of the two peaks does not decrease with increasing angle of incidence. Thus, it is not possible to determine accurately what color has been observed, where color is defined by the resonant wavelength. Uncertainty concerning color increases with increasing angle of incidence. This gives rise to a loss of spectrum resolution for spectroscopic applications.

FIG. 11 also shows a set of curves similar to those shown in FIGS. 3 and 10, for a photodetector having a structure similar to the above-described example photodetector of the invention, but with a mirror that is different. The mirror is structured with periodic repetition of a pattern having only one portion in relief and one slot.

Furthermore, the period P is selected to lie in the range 0.5 λ/nSC to 1.5 λ/nSC where nSC is the real part of the refractive index of the semiconductor material, the width L of the portion in relief lying in the range 9P/10 to P/2, and the depth h of the slot lying in the range λ/100 to λ/15.

The photodetector selected in this example presents a period P equal to 1490 nm, the width L of the portion in relief is 1190 nm, and the height h of the portion in relief is 125 nm, for λ=4300 nm.

Consequently, the width of the slot is 300 nm.

FIG. 11 also plots five curves $H_1$ to $H_5$ that give the quantum efficiency of the photodetector as a function of wavelength for the light having angles of incidence in the range 0° to 4°.

FIG. 11 shows that for light perpendicular to the photodetector (curve $H_1$), the response of the photodetector has only one peak at the resonant wavelength.

Nevertheless, as soon as the angle of incidence is no longer zero (curves $H_2$ to $H_5$), the response of the photodetector includes not only a peak at the resonant wavelength, but also a secondary absorption peak.

Furthermore, the height of the main resonance peak remains approximately stable with increasing angle of incidence. Nevertheless, the resonant wavelength shifts with increasing angle.

Thus, relative to the photodetector corresponding to FIG. 11, the photodetector of the present invention presents the advantage of eliminating the offset of the main resonance peak with angle of incidence, and also of eliminating the secondary resonance peaks for angles of incidence greater than 2°. Another advantage is the elimination of background absorption around the main peak and thus obtaining better rejection.

Reference is now made to FIG. 4.

The curve $Q_1$ presents the maximum value of quantum efficiency as a function of the thickness g of the spacer layer, for a photodetector in which the other parameters correspond to the above-described example photodetector.

More precisely, for the curve $Q_1$, the maximum value of the quantum efficiency is given for resonance at 4080 nm.

The curve $Q_1$ presents a peak when g has a value substantially equal to 175 nm.

When g has a value equal to 500 nm, the maximum value of the quantum efficiency is about 80% of the corresponding value for g equal to 175 nm.

The curve $Q_2$ gives the mean value of the quantum efficiency for two wavelengths, one equal to 3800 nm and the other equal to 4280 nm.

These two wavelengths are selected to lie outside the resonance peak and more particularly to be spaced apart from the value of the resonant wavelength by a value corresponding substantially to the half-height width of the resonance peak.

This curve $Q_2$ still corresponds to the example photodetector of the invention as described above, except for variation in the value of g.

Finally, curve $Q_3$ is similar to curve $Q_2$ but for a photodetector having a mirror without structuring. This photodetector otherwise has the same structure as the photodetector of the invention, and also the same constituent materials.

It can be seen that for values of g lying in the range $\lambda/12ne$ to $\lambda/3ne$, i.e. about 125 nm to 500 nm, the photodetector of the invention decreases absorption in the semiconductor layer around the resonance peak (curve $Q_2$), compared with a photodetector having a mirror without structuring (curve $Q_3$).

This shows that the photodetector of the invention serves to improve spectral rejection.

Reference is now made to FIG. 5 which shows five curves $G_1$ to $G_5$, these curves giving the maximum value of the quantum efficiency of a photodetector of the invention as a function of the angle of incidence of the incident light, for different values of g.

In FIG. 5, the photodetector has the same dimensions as in the above-described example. Thus, the resonant wavelength is situated at 4080 nm.

The curve $G_1$ corresponds to g having a value of 50 nm, the curve $G_2$ to g having a value of 150 nm, the curve $G_3$ to g having a value of 250 nm, the curve $G_4$ to g having a value of 350 nm, and finally the curve $G_5$ to g having a value of 450 nm.

FIG. 5 shows that for the curve $G_1$, the photodetector has a maximum value of quantum efficiency that is practically constant for an angle of incidence lying in the range 0° to 4°.

For values of g greater than 50 nm, the curves $G_2$ to $G_5$ show that the maximum value of quantum efficiency decreases relatively little for an angle of incidence lying in the range 0° to 2°. In contrast, this value decreases much more quickly once the angle of incidence is greater than 2°.

Thus, FIG. 5 confirms that a photodetector of the invention presents a well-defined acceptance angle for values of g greater than 50 nm.

In the example shown, this acceptance angle is about 2°, which corresponds to about 5° in air.

Furthermore, this figure confirms the insensitivity of the photodetector to angle over a range of ±2°.

FIG. 6 shows three curves $G'_1$, $G'_2$, and $G'_4$.

Each of these curves plots the wavelength corresponding to the maximum value of the quantum efficiency as a function of the angle of incidence of the light and for different values of g.

The values used were selected from those used for the curves $G_1$ to $G_5$. Thus, the curve $G'_1$ (-○-) corresponds to g=50 nm, the curve $G'_2$ (-□-) to g=150 nm, and the curve $G'4$ (-•-) to g=350 nm.

FIG. 6 shows that the value of the resonant wavelength shifts with angle of incidence. Nevertheless, this shift is practically independent of the value of g. For all of the values of g under consideration, the resonant wavelength is subject to a redshift of about 1% for angles of incidence lying in the range 0° to 2°.

This thus confirms the observations made with reference to FIG. 3.

FIG. 7 shows four curves $T_1$ to $T_4$. Each of them plots the quantum efficiency of a photodetector of the invention as a function of wavelength for differing values of the refractive index ns of the substrate.

Curve $T_1$ corresponds to ns having a value of 1, curve $T_2$ to ns having a value of 1.5, curve $T_3$ to ns having a value of 2, and curve $T_4$ to ns having a value of 2.68.

The photodetector in question for the curve $T_4$ corresponds to the above-described example.

In the other curves, the values of h and g are constant.

Nevertheless, the values for the widths $L_3$ and $L_4$ of the slots and for the width $L_1$ of one of the portions in relief are adjusted so that the value of the resonance wavelength is substantially identical for all four curves.

The values of the various parameters are given in detail in the table below.

| ns | P | $L_1$ | $L_3 = L_4$ | $\lambda_{max}$ | $QE_{max}$ |
|---|---|---|---|---|---|
| 2.68 | 1490 | 740 | 125 | 4080 | 0.63 |
| 2 | 1725 | 862 | 145 | 4100 | 0.62 |
| 1.5 | 1950 | 973 | 160 | 4100 | 0.68 |
| 1 | 2250 | 1125 | 185 | 4100 | 0.69 |

The curves $T_1$ and $T_4$ show that the maximum value of quantum efficiency can be increased by about 10% with a photodetector that does not have a substrate, the corresponding refractive index being that of air.

This value of 10% is considered relative to the above-described example photodetector for which ns is equal to 2.68.

Nevertheless, this increase is associated with the photodetector having rejection that is less good.

FIG. 8 is a plan view of a mirror having two-dimensional structuring.

The structuring shown consists in a grating of portions in relief 80, 81, and 82 in the form of square and rectangular studs. The dashed outline identifies a structuring pattern, this pattern being in the form of a cell and being repeated with the period P.

In general, the grating then presents two cross-bundles of parallel recessed lines.

Another way of structuring that does not consist in studs in relief on the surface 130, but rather in holes formed from that surface, is not suitable in the context of the invention.

Having structuring in two dimensions makes it possible to make the photodetector independent of polarization.

Reference is now made to FIG. 9 which shows two curves $R_1$ and $R_2$. These two curves show the quantum efficiency of a photodetector as a function of wavelength for incident light perpendicular to the photodetector and for an operating temperature of 77 K.

The curve $R_1$ corresponds to a photodetector of the invention in which the mirror has one-dimensional structuring, in compliance with the above-described example photodetector.

Thus, the curve $R_1$ corresponds to the curve $C_1$ of FIG. 2.

The curve $R_2$ corresponds to a photodetector of the invention, having the same characteristics as the above-described example photodetector, except concerning the mirror. The mirror in this example is structured in two dimensions. In other words, the mirror is made to be periodic in two directions in the plane of the mirror. The mirror can thus present structuring of the kind shown diagrammatically in FIG. 8.

Comparing the curves $R_1$ and $R_2$ shows that both types of photodetector lead to an increase in absorption that is similar.

It may be observed that background absorption is further reduced in a photodetector having a mirror with two-dimensional structuring, and thus rejection is increased.

Finally, it should be observed that the photodetector presents advantages that are conventionally associated with the presence of a thin semiconductor layer. This is a reduction in the diffusion volume of the photogenerated carriers, thereby limiting the dark noise of the photodetector. Consequently, the operating temperature of the photodetector can be increased and the cost of the cooling system correspondingly decreased.

Another advantage is the increase in the bandwidth of the speed of detection, resulting from the reduced size of the photodetector.

The infrared photodetector of the invention may be used in numerous applications. It may be used for security concerning property and people (surveillance, thermal camera for detecting fire, avoiding obstacles when driving at night), detecting leaks, and non-destructive inspection in industrial installations (transporting fluids or electricity, air and rail transport), environmental inspections (space imaging, building energy diagnoses), and finally medical diagnoses (inflammations).

The reference signs inserted after technical characteristics that appear in the claims are solely for the purpose of facilitating understanding of the claims and do not limit their scope.

The invention claimed is:

1. A photodetector for infrared light radiation having a given wavelength ($\lambda$), the photodetector comprising a stack of layers with:
   a continuous layer (11) of a partially absorbent semiconductor material constituting the photodetection zone;
   a spacer layer (12) of material that is transparent at said wavelength and of refractive index ne; and
   a structured metal mirror (13), the distance (g) between the top of said mirror and the continuous layer of semiconductor material being less than $\lambda$/ne and the surface of the mirror presenting a profile corresponding to periodically repeating a unit pattern at a period (P), the pattern being defined by an alternating succession of portions in relief (131, 132) and of slots (133, 134) of respective widths ($L_1$, $L_2$) and ($L_3$, $L_4$), the widths ($L_1$ to $L_4$) being such that none of them is zero, their sum is equal to P, and at least $L_1 \neq L_2$ or $L_3 \neq L_4$.

2. A photodetector according to claim 1, wherein the thickness (e) of the layer (11) of semiconductor material satisfies the following relationship:

$$e \leq 0.7 \times \frac{\lambda}{4 \times \pi \times kSC}$$

where kSC is the imaginary part of the refractive index of said semiconductor material.

3. A photodetector according to claim 1, wherein the depth (h) of the slots lies in the range $\lambda$/12nc to $\lambda$/5nc, where nc is the real part of the index of the material present in the slots (133, 134).

4. A photodetector according to claim 1, including, on the layer (12) of semiconductor material, a substrate that is transparent at said wavelength and that is of refractive index ns.

5. A photodetector according to claim 4, wherein the period (P) is equal to $\lambda$/neff, where neff lies in the range min(ns, ne, nSC) and max(ns, ne, nSC), where nSC is the real part of the refractive index of said semiconductor material.

6. A photodetector according to claim 1, wherein the width ($L_1$, $L_2$) of one of the portions in relief (131, 132) lies in the range (P/2)–$L_3$ and (2P/3)–$L_3$, and the widths ($L_3$, $L_4$) of the slots (133, 134) lie in the range $\lambda$/15ne to $\lambda$/5ne.

7. A photodetector according to claim 1, wherein g lies in the range $\lambda$/15ne to $\lambda$/3ne.

8. A photodetector according to claim 1, wherein the refractive index ne is greater than nSC/2, where nSC is the real part of the refractive index of the continuous layer (11) of the partially absorbent semiconductor material.

9. A photodetector according to claim 1, wherein the grating of said mirror (13) presents a bundle of recessed lines.

10. A photodetector according to claim 1, wherein the grating of said mirror (13) presents two cross-bundles of recessed lines.

11. A photodetector according to claim 1, wherein the semiconductor material is selected from Si, Ge, SiGe, InAs, InSb, GaSb, PbS, PbSe, PbTe, and $Cd_xHg_{1-x}Te$ (with x<0.9), from ternary alloys such as InGaAsP, AlInAs, AlInSb, InAsSb, and InGaSb, from quaternary alloys such as InGaAsP and InGaAsSb, and from quinary alloys such as GaInAsSb or GaInAsSbP, and indeed a type II superlattice.

12. A photodetector according to claim 1, wherein the material of the spacer layer (12) is selected from ZnS, CdTe, and III-V materials.

* * * * *